US012659037B2

(12) United States Patent
Yuen

(10) Patent No.: US 12,659,037 B2
(45) Date of Patent: Jun. 16, 2026

(54) PLURALITY OF EMITTERS FOR COUPLING LASER BEAMS INTO A MULTI-MODE OPTICAL FIBER

(71) Applicant: Lumentum Operations LLC, San Jose, CA (US)

(72) Inventor: Albert Yuen, Palo Alto, CA (US)

(73) Assignee: Lumentum Operations LLC, San Jose, CA (US)

( * ) Notice: Subject to any disclaimer, the term of this patent is extended or adjusted under 35 U.S.C. 154(b) by 535 days.

(21) Appl. No.: 18/172,924

(22) Filed: Feb. 22, 2023

(65) Prior Publication Data

US 2024/0195506 A1 Jun. 13, 2024

Related U.S. Application Data

(60) Provisional application No. 63/386,568, filed on Dec. 8, 2022.

(51) Int. Cl.
H04B 10/2581 (2013.01)
H01S 5/42 (2006.01)

(52) U.S. Cl.
CPC ......... H04B 10/2581 (2013.01); H01S 5/423 (2013.01)

(58) Field of Classification Search
CPC .............. H04B 10/2581; H04B 10/503; H04B 10/502; H01S 5/423; H01S 5/18311; H01S 5/18333; H01S 5/065; H01S 5/42; H01S 5/405; H01S 5/005; H01S 5/02345; G01S 7/4816
See application file for complete search history.

(56) References Cited

U.S. PATENT DOCUMENTS

| | | | | |
|---|---|---|---|---|
| 10,983,197 B1 * | 4/2021 | Zhu | ...................... | G01S 7/4816 |
| 2007/0201527 A1 * | 8/2007 | Hori | ................... | H01S 5/18333 |
| | | | | 372/102 |
| 2018/0084614 A1 * | 3/2018 | Bower | .................. | H05K 3/225 |
| 2019/0393199 A1 * | 12/2019 | Kawano | .............. | H10H 20/857 |
| 2020/0119521 A1 * | 4/2020 | Feng | ...................... | H01S 5/065 |
| 2020/0244040 A1 * | 7/2020 | Wang | ................. | H01S 5/18311 |

* cited by examiner

*Primary Examiner* — Hibret A Woldekidan
(74) *Attorney, Agent, or Firm* — Harrity & Harrity, LLP

(57) ABSTRACT
An optical data communication device includes a plurality of emitters. The plurality of emitters are configured to emit respective laser beams that are associated with a same spectral range and that are to couple into an input end of a multi-mode optical fiber. A size of an oxide aperture of each emitter, of the plurality of emitters, is less than or equal to 3.5 micrometers. Each emitter is a single-mode emitter or a reduced-mode emitter. A pitch between adjacent emitters is less than or equal to 30 micrometers. The plurality of emitters are disposed in a configuration pattern, wherein a central region of the configuration pattern does not include any emitter of the plurality of emitters.

20 Claims, 6 Drawing Sheets

PLURALITY OF EMITTERS FOR COUPLING LASER BEAMS INTO A MULTI-MODE OPTICAL FIBER

CROSS-REFERENCE TO RELATED APPLICATION

This Patent Application claims priority to U.S. Provisional Patent Application No. 63/386,568, filed on Dec. 8, 2022, and entitled "PLURALITY OF SINGLE-MODE EMITTERS FOR MULTI-MODE COMMUNICATION." The disclosure of the prior Application is considered part of and is incorporated by reference into this Patent Application.

TECHNICAL FIELD

The present disclosure relates generally to a plurality of emitters, and to a plurality of emitters to facilitate data communication.

BACKGROUND

An emitter can include a vertical-emitting device, such as a vertical cavity surface emitting laser (VCSEL). A VCSEL is a laser in which a beam is emitted in a direction perpendicular to a surface of the VCSEL (e.g., vertically from a surface of the VCSEL). Multiple emitters may be arranged in an emitter array with a common substrate.

SUMMARY

In some implementations, an optical data communication device includes a plurality of emitters, wherein: the plurality of emitters are configured to emit respective laser beams that are associated with a same spectral range and that are to couple into an input end of a multi-mode optical fiber; and an area of an oxide aperture of each emitter, of the plurality of emitters, is less than or equal to an area of a circle with a 3.5 micrometers diameter.

In some implementations, an optical data communication device includes a plurality of emitters, wherein: the plurality of emitters are configured to emit respective laser beams that are to couple into an input end of a multi-mode optical fiber; and a size of an oxide aperture of each emitter, of the plurality of emitters, is less than or equal to 3.5 micrometers.

In some implementations, an optical data communication device includes a plurality of emitters, wherein: the plurality of emitters are configured to emit respective laser beams; and a size of an oxide aperture of each emitter, of the plurality of emitters, is less than or equal to 3.5 micrometers.

DETAILED DESCRIPTION

Figures 1A, 1B:
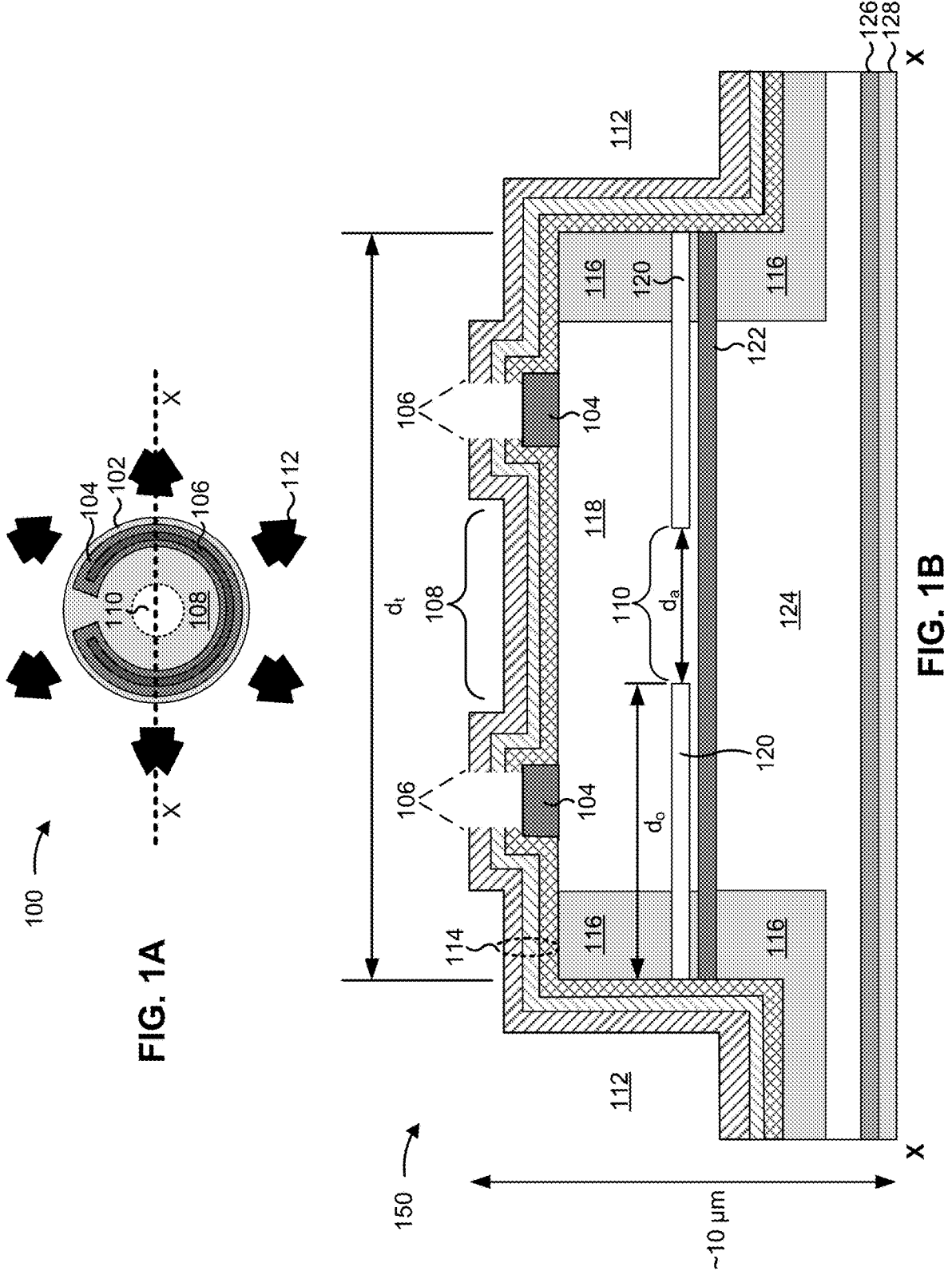
FIGS. 1A and 1B are diagrams depicting an example emitter described herein.

The following detailed description of example implementations refers to the accompanying drawings. The same reference numbers in different drawings may identify the same or similar elements.

For optical data communication, a VCSEL can be used to emit a laser beam that couples into an optical fiber. However, a laser beam emitted by a single VCSEL has limited optical power, which limits its practical use over long distances (e.g., greater than 500 meters). To increase optical power, multiple VCSELs can be used to emit multiple laser beams that are associated with a same spectral range, but such laser beams typically have many modes (e.g., greater than or equal to four modes), and combining the laser beams together into a single optical fiber (e.g., a single multimode fiber) creates modal noise that affects the quality of the combined laser beam. This leads to errors in the optical data communication.

One way to mitigate modal noise issues is to use wavelength division multiplexing (WDM), where multiple VCSELs emit multiple laser beams of different wavelengths. A multiplexer combines the multiple laser beams into a single laser beam that couples into an optical fiber. The single laser beam, after transmitting via the optical fiber, is split into the laser beams of multiple wavelengths using a demultiplexer. The multiple laser beams are then provided to different photodetectors assigned to receive information on respective wavelengths. But this technique adds complexity (e.g., in terms of design, assembly, and operation) and requires inclusion of multiple other complex components (e.g., a multiplexer, demultiplexer, and specialized photodetectors).

Some implementations described herein provide an optical data communication device that includes a plurality of emitters (e.g., VCSELs). The plurality of emitters are configured to emit respective laser beams that are associated with a same spectral range and that are to couple into an input end of a multi-mode optical fiber. A size of respective oxide apertures of the plurality of emitters is reduced (e.g., to be less than or equal to 3.5 μm). This causes the plurality of emitters to be single-mode emitters (e.g., emit laser beams with only one mode) or reduced-mode emitters (e.g., emit laser beams with less than or equal to three modes). Accordingly, because the laser beams each have a reduced number of modes (e.g., three or less modes), when the laser beams combine (e.g., in a core of the multi-mode optical fiber), an amount of modal noise is reduced (e.g., compared to a combination of multi-mode laser beams emitted by multimode VCSELs). This improves a quality of the combined laser beam, which reduces a likelihood of error in optical data communication. Further, the laser beams are associated with the same spectral range, so other components (e.g., multiplexer, demultiplexer, and/or specialized photodetector, among other examples) do not need to be used, which decreases a complexity (e.g., terms of design, assembly, and operation) of the optical data communication device (e.g., as compared to an optical data communication device that utilizes WDM).

Additionally, in some implementations, the plurality of emitters are connected by a single metal contact. In this way, a controller of the optical data communication device is able to uniformly control the plurality of emitters (e.g., by modulating power to the plurality of emitters via the metal contact), which enables the respective laser beams to combine to provide a combined laser beam with increased optical power (e.g., an optical power that is greater than an optical power of a laser beam emitted by one emitter).

Further, the plurality of emitters may be arranged in a configuration pattern, which reduces an amount of light (e.g., from the laser beams that are emitted by the plurality of emitters) that is reflected back from the input end of the multi-mode optical fiber (e.g., that is not coupled into the core of the multi-mode optical fiber) and that couples back into the plurality of emitters. This minimizes an amount modal noise associated with the plurality of emitters, and, accordingly, a relative intensity noise (RIN) associated with the plurality of emitters is reduced. This improves a quality of the individual laser beams and therefore further improves the quality of the combined laser beam, which further reduces a likelihood of error in optical data communication.

FIGS. 1A and 1B are diagrams depicting a top-view of an example emitter 100 of a VCSEL device and a cross-sectional view 150 of example emitter 100 along the line X-X, respectively. As shown in FIG. 1A, emitter 100 may include a set of emitter layers constructed in an emitter architecture.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g., a dielectric layer, a passivation layer, and/or the like) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes an oxide aperture 110 (e.g., an oxide aperture formed by an oxidation layer of emitter 100 (not shown), also referred to as a current confinement aperture). Oxide aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The quantity and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, and/or the like. In some implementations, trench 112 may encircle emitter 100 to form a mesa structure $d_r$. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top-emitting or bottom-emitting) optical device. Additionally, the design of emitter 100 may apply to emitters of any wavelength, power level, emission profile, and/or the like. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside anode layer 128, a substrate layer 126, a bottom mirror 124, an active region 122, an oxidation layer 120, a top mirror 118, an implant isolation material 116, a protective layer 114 (e.g., a dielectric passivation/mirror layer), and an ohmic metal layer 104. As shown, emitter 100 may have, for example, a total height that is less than or equal to 10 μm.

Backside anode layer 128 may include a layer that makes electrical contact with substrate layer 126. For example, backside anode layer 128 may include an annealed metallization layer, such as a gold-germanium-nickel (AuGeNi) layer, a palladium-germanium-gold (PdGeAu) layer, and/or another annealed metallization layer.

Substrate layer 126 may include a base substrate layer upon which epitaxial layers are grown. For example, substrate layer 126 may include a semiconductor layer, such as a such as a gallium arsenide (GaAs) layer, an indium phosphide (InP) layer, and/or another semiconductor layer.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

As shown in FIG. 1B, when emitter 100 is a top-emitting laser (e.g., a top-emitting VCSEL), oxidation layer 120 may be positioned between active region 122 and optical aperture 108, from which emitter 100 emits a laser beam. In some implementations, when emitter 100 is a bottom-emitting laser (e.g., a bottom-emitting VCSEL), active region 122 may be positioned between oxidation layer 120 and optical aperture 108, from which emitter 100 emits a laser beam.

Oxide aperture 110 may include an optically active aperture defined by oxidation layer 120. A size (e.g., a diameter, a width, or another size measurement) of oxide aperture 110 (e.g., identified as da in FIG. 1B) may range, for example, from 1 micrometer (μm) to 3.5 μm (e.g., the size may be greater than or equal to 1 μm and less than or equal to 3.5 μm). In a particular example, the size of oxide aperture 110 may range from 1 μm to 2.9 μm. This may cause the emitter 100 to be a single-mode (SM) emitter (e.g., emit a laser beam with only one mode, such as fundamental mode). In another particular example, the size of oxide aperture 110 may range from 3 μm to 3.5 μm. This may cause the emitter 100 to be a reduced-mode (RM) emitter (e.g., emit a laser beam with three or less modes, such as a fundamental mode and one or two higher order modes). In some implementations, an area of the oxide aperture 110 may range, for example, be less than or equal to an area of a circle with a diameter that ranges from, for example, 1 μm to 3.5 μm. In a particular example, the area of the oxide aperture 110 may be less than or equal to an area of a circle with a diameter that ranges from 1 μm to 2.9 μm. This may cause the emitter 100 to be an SM emitter. In another particular example, the area of the oxide aperture 110 may be less than or equal to an area of a circle with a diameter that ranges from 3 μm to 3.5 μm. This may cause the emitter 100 to be an RM emitter.

In some implementations, the size of oxide aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and oxide aperture 110. In some implementations, oxide aperture 110 may include an aperture associated with a type of current confinement technique, such as an etched mesa, a region without ion implantation, and/or lithographically defined intra-cavity mesa and regrowth, among other examples.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a silicon dioxide ($SiO_2$) layer, a silicon-nitride ($Si_3N_4$ layer), an aluminum-oxide ($Al_2O_3$ layer), or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over oxide aperture 110 through which light may be emitted.

Ohmic metal layer 104 may include a layer that makes electrical contact through which electrical current may flow. For example, ohmic metal layer 104 may include a titanium (Ti) and a gold (Au) layer, a Ti and a platinum (Pt) layer, and/or an Au layer, among other examples, through which electrical current may flow (e.g., through a bondpad (not shown) that contacts ohmic metal layer 104 through via 106). Ohmic metal layer 104 may be P-ohmic, N-ohmic, or another type of metal layer. Selection of a particular type of ohmic metal layer 104 may depend on the architecture of the emitters. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside anode layer 128 may be deposited on a bottom side of substrate layer 126.

The quantity, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 2A:
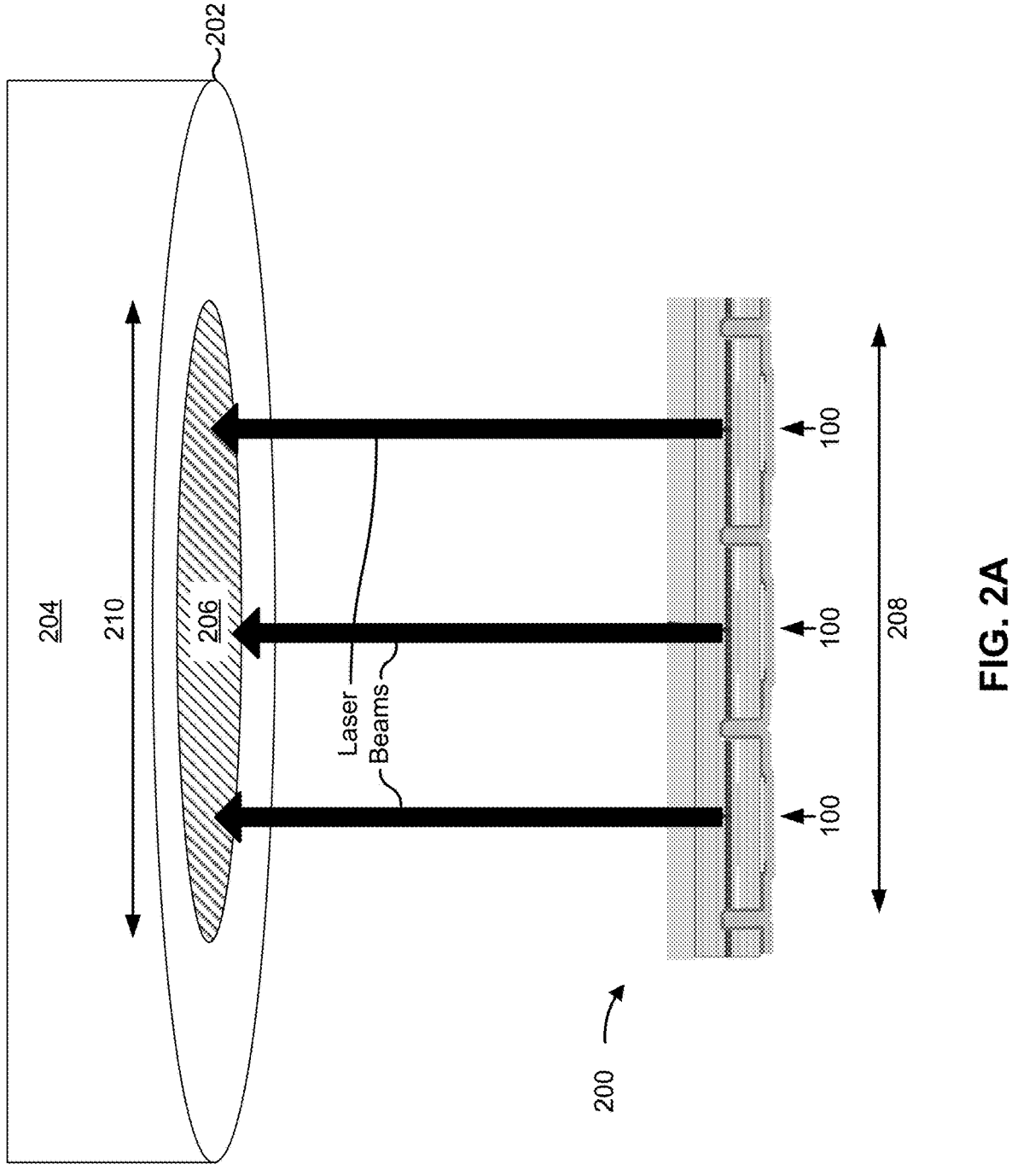
FIGS. 2A-2C are cross-sectional views of different configurations of an example optical data communication device described herein.
Figure 2B:
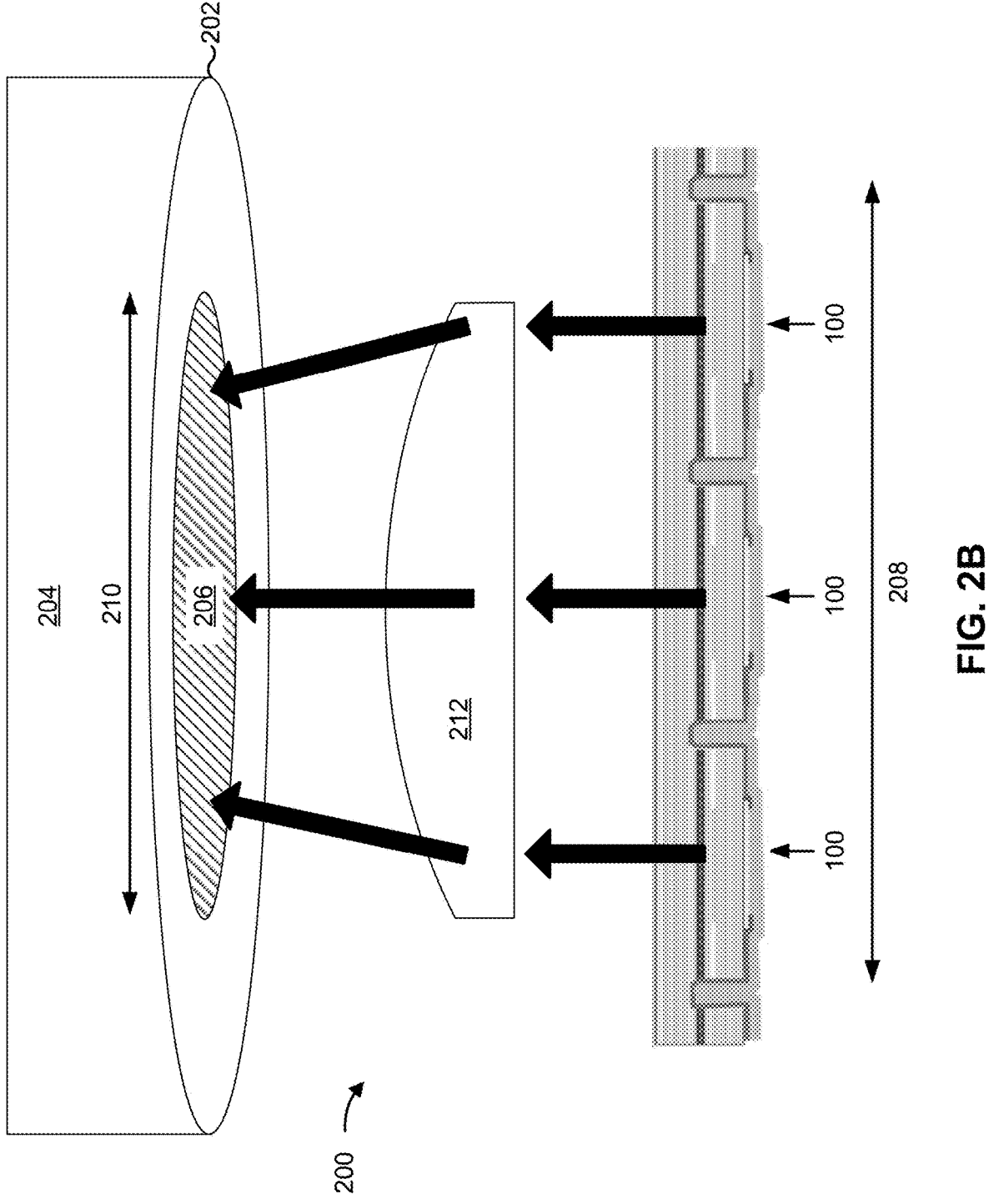
Figure 2C:
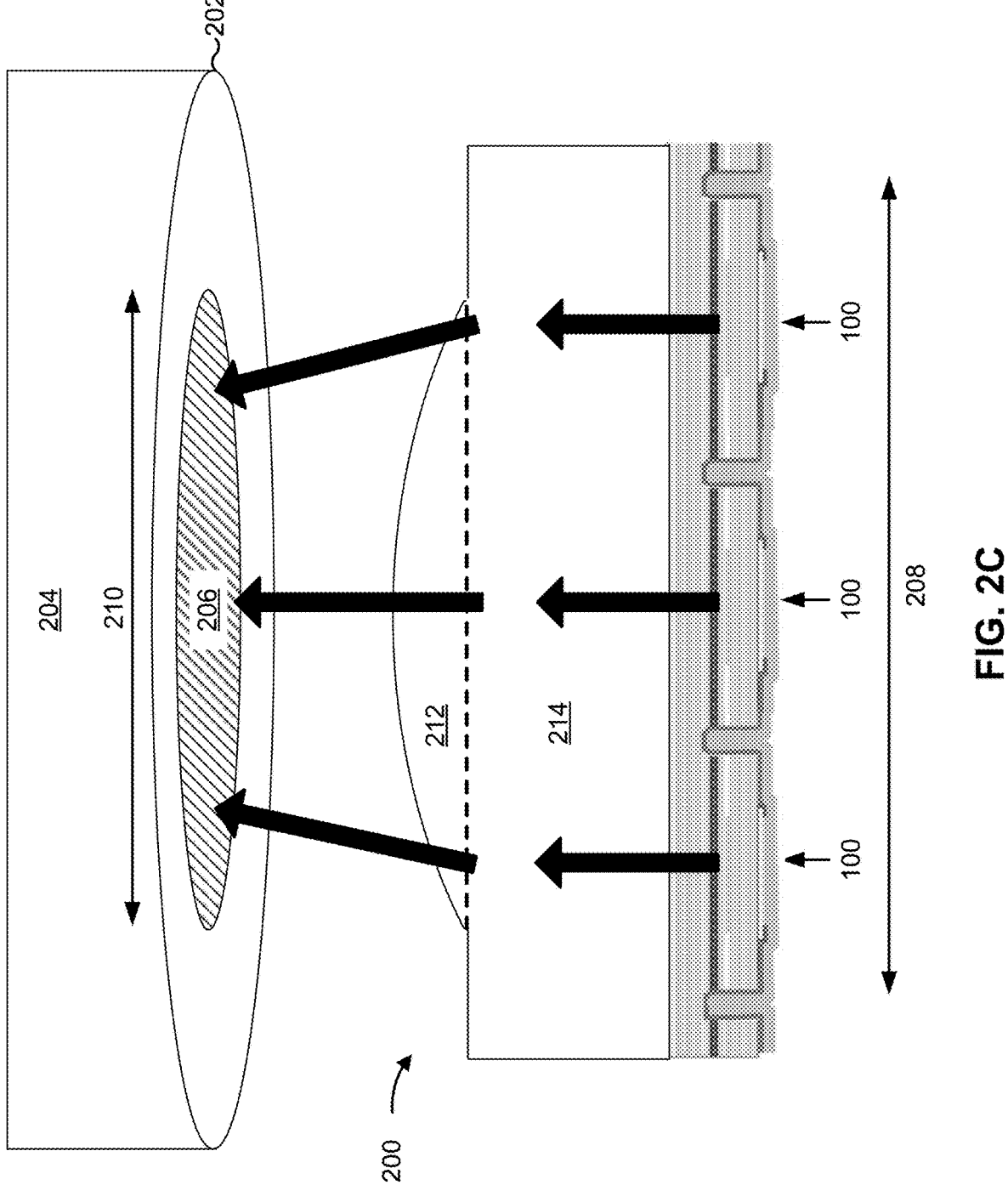

FIGS. 2A-2C are cross-sectional views of different configurations of an example optical data communication device 200 described herein. As shown in FIGS. 2A-2C, the optical data communication device 200 may include a plurality of emitters 100.

The plurality of emitters 100 may be configured to emit respective laser beams that are to couple into (e.g., enter into) an input end 202 of a multi-mode optical fiber 204. The respective laser beams may be associated with a same spectral range. That is, each emitter 100, of the plurality of emitters 100, may be configured to emit a laser beam associated with a particular spectral range. For example, each emitter may be configured to emit a laser beam associated with a spectral range that has an 850 nanometer (nm) center wavelength. The plurality of emitters 100 may be connected by a metal contact (e.g., metal contact 308 described herein, not shown in FIGS. 2A-2C). In this way, a controller of the optical data communication device 200 (not shown in FIGS. 2A-2C) may uniformly control the plurality of emitters 100 (e.g., by modulating power to the plurality of emitters 100 via the metal contact), which enables the respective laser beams to combine to provide a combined laser beam with increased optical power (e.g., an optical power that is greater than an optical power of a laser beam emitted by any one emitter 100 of the plurality of emitters 100).

In some implementations, each emitter 100, of the plurality of emitters 100, may be an SM emitter (e.g., emit a laser beam with only one mode, such as fundamental mode). For example, a size (e.g., a diameter, a width, or another size measurement) of an oxide aperture 110 of each emitter 100 may range from 1 μm to 2.9 μm (e.g., the size may be greater than or equal to 1 μm and less than or equal to 2.9 μm), which may cause each emitter 100 to be an SM emitter. Alternatively, each emitter 100, of the plurality of emitters 100, may be an RM emitter. For example, a size of an oxide aperture 110 of each emitter 100 may range from 3 μm to 3.5 μm (e.g., the size may be greater than or equal to 3 μm and less than or equal to 3.5 μm), which may cause each emitter 100 to be an RM emitter (e.g., emit a laser beam with three or less modes, such as a fundamental mode and one or two higher order modes).

As shown in FIGS. 2A-2C, the plurality of emitters 100 may be proximate to the input end 202 of the multi-mode optical fiber 204 (e.g., within a threshold distance, which may be less than or equal to 100 μm, 200 μm, 500 μm, or 1000 μm, among other examples). Accordingly, the plurality of emitters 100 may be disposed in a configuration pattern (e.g., a configuration pattern 302 described herein), such as an array, which may enable the plurality of emitters 100 to emit the respective laser beams at the input end 202 of the multi-mode optical fiber 204 (e.g., to allow the respective laser beams to couple into the input end 202 of the multi-mode optical fiber 204). In some implementations, the plurality of emitters 100 may be disposed in the configuration pattern (e.g., proximate to the input end 202 of the multi-mode optical fiber 204) such that the respective laser beams may transmit to the input end 202 of the multi-mode optical fiber 204 (e.g., without redirection). For example, as show in FIG. 2A, a size 208 (e.g., a diameter, a width, or another size measurement) of the configuration pattern may be less than or equal to a size 210 of a core 206 (e.g., a diameter, a width, or another size measurement, which may range from 50 μm to 62.5 μm) of the multi-mode optical fiber 204 at the input end 202. The configuration pattern may be aligned with the core 206 of the multi-mode optical fiber 204 at the input end 202 such that the plurality of emitters 100 may emit the respective laser beams directly at the core 206 of the multi-mode optical fiber 204 at the input end 202 (e.g., to allow the respective laser beams to couple into the core 206 of the multi-mode optical fiber 204).

In some implementations, the optical data communication device 200 may include a lens 212. The lens 212 may comprise a glass, a polymer, or another material. The lens 212 may be configured to converge the respective laser beams emitted by the plurality of emitters 100 (e.g., on the input end 202 of the multi-mode optical fiber 204). For example, as shown in FIG. 2B, the lens 212 may be configured to converge the respective laser beams on the core 206 of the multi-mode optical fiber 204 at the input end 202. Accordingly, as further shown in FIG. 2B, the size 208 of the configuration pattern of the plurality of emitters 100 may be greater than the size of the core 206 of the multi-mode optical fiber 204 at the input end 202 (e.g., because the lens 212 is configured to converge the respective laser beams on the core 206 of the multi-mode optical fiber 204 at the input end 202). The configuration pattern may be aligned with the lens 212 and the core 206 of the multi-mode optical fiber 204 at the input end 202 such that the plurality of emitters 100 emit may emit the respective laser beams at the core 206 of the multi-mode optical fiber 204 at the input end 202 via the lens 212.

The lens 212 may be an individual component that is included in the optical data communication device 200, such as shown in FIG. 2B. Alternatively, the lens 212 may be an integrated component that is included in the optical data communication device 200. For example, as shown in FIG. 2C, the plurality of emitters 100 (e.g., shown in a bottom-emitting configuration) may be formed in a substrate 214 (e.g., that includes the substrate layer 126, described herein) and the lens 212 may be formed in the substrate 214 (e.g., as an integrated component of the substrate 214).

As indicated above, FIGS. 2A-2C are provided as examples. Other examples may differ from what is described with regard to FIGS. 2A-2C. In practice, the optical data communication device 200 may include additional components and/or elements, fewer components and/or elements, different components and/or elements, or differently arranged components and/or elements than those shown in FIGS. 2A-2C.

Figure 3A:
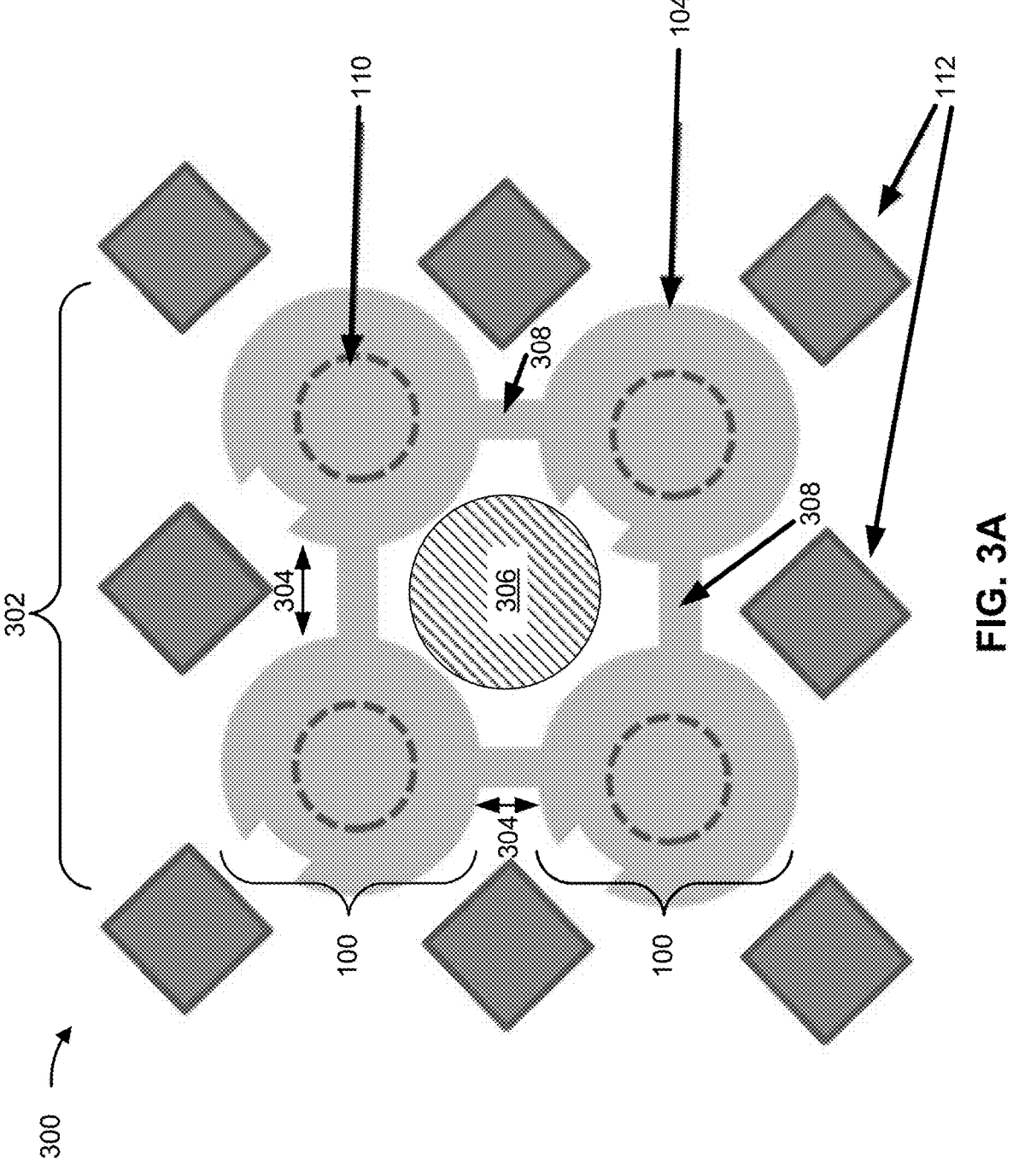
FIGS. 3A-3B are top-down views of different configurations of the example optical data communication device described herein.
Figure 3B:
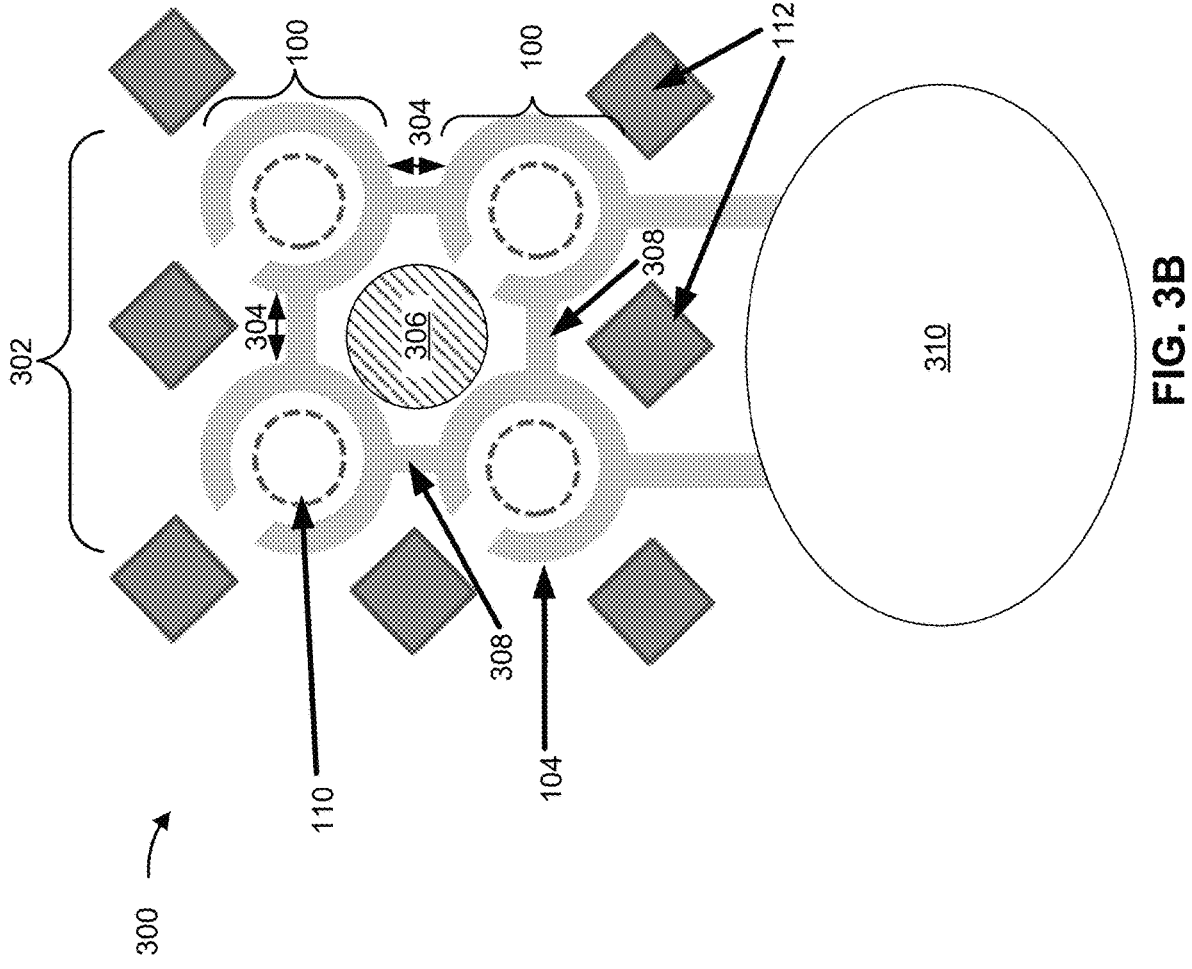

FIGS. 3A-3B are top-down views of different configurations 300 of the example optical data communication device 200 described herein. As shown in FIGS. 3A-3B, the optical data communication device 200 may include the plurality of emitters 100, which may be disposed in a configuration pattern 302. FIGS. 3A-3B show particular examples of the configuration pattern 302 that include four emitters 100, but the configuration pattern 302 may include any number of emitters 100 (e.g., greater than or equal to two emitters 100). FIG. 3A shows a first example of the configuration pattern 302 when the plurality of emitters 100 include bottom-emitting emitters (e.g., bottom-emitting VCSELs); and FIG. 3B shows a second example of the configuration pattern 302 when the plurality of emitters 100 include top-emitting emitters (e.g., top-emitting VCSELs).

As shown in FIGS. 3A-3B, the plurality of emitters 100, when in the configuration pattern 302, may be disposed in an array (e.g., a one-dimensional array, or a two-dimensional array), or another arrangement, where a pitch 304 between adjacent emitters 100 (e.g., a distance between emitters 100 that are next to each other in a row or column of the array) satisfies (e.g., is less than or equal to) a pitch threshold. The pitch threshold may be, for example, less than or equal to 10 μm, 20 μm, 30 μm, 40 μm, or 50 μm. The plurality of emitters 100 may therefore be in "close proximity" with each other. Accordingly, the plurality of emitters 100 may be configured to emit respective laser beams that are to couple into the input end 202 of the multi-mode optical fiber 204 (e.g., as described elsewhere herein).

As further shown in FIGS. 3A-3B, the configuration pattern 302 may include a region 306 (e.g., a central region) that is not associated with any emitter of the plurality of emitters 100. That is, no emitter 100 is coextensive with the region 306. In some implementations, the region 306 of the configuration pattern 302 may be aligned with a region (e.g., a central region) of the input end 202 of the multi-mode optical fiber 204 (e.g., that is associated with the core 206 of the multi-mode optical fiber 204 at the input end 202). In this way, when at least some light from the respective laser beams emitted by the plurality of emitters 100 is reflected back from the region of the input end 202 of the multi-mode optical fiber 204 (e.g., that is not coupled into the core 206 of the multi-mode optical fiber 204), the light may not couple back into one or more emitters 100 of the plurality of emitters 100. This minimizes an amount modal noise associated with the one or more emitters 100. Accordingly, an RIN associated with the one or more emitters 100 may be reduced. In some implementations, the region 306 may include only respective portions of one or more emitters 100, of the plurality of emitters 100, to reduce an amount of light that is coupled back into the one or more emitters 100.

As further shown in FIGS. 3A-3B, each emitter 100 may include an oxide aperture 110 and an ohmic metal layer 104, and may include one or more trenches 112 (e.g., as described herein in relation to FIGS. 1A-1B). The plurality of emitters 100 (e.g., via respective ohmic metal layers 104) may be connected by a metal contact 308 of the optical data communication device 200. In this way, a controller of the optical data communication device 200 (not shown in FIGS. 3A-3C) may uniformly control the plurality of emitters 100 (e.g., by modulating power to the plurality of emitters 100 via the metal contact 308), which enables the respective laser beams emitted by the plurality of emitters 100 to combine to provide an optical data signal with increased optical power (e.g., an optical power that is greater than an optical power of a laser beam emitted by any one emitter 100 of the plurality of emitters 100). As shown in FIG. 3B, the example optical data communication device 200 may include a bondpad 310 that connects to the metal contact 308, and through which electrical current may flow to power the plurality of emitters 100.

As indicated above, FIGS. 3A-3B are provided as examples. Other examples may differ from what is described with regard to FIGS. 3A-3B. In practice, the optical data communication device 200 may include additional components and/or elements, fewer components and/or elements, different components and/or elements, or differently arranged components and/or elements than those shown in FIGS. 3A-3B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical data communication device, comprising:
   a single metal contact;
   a bondpad connected to the single metal contact; and
   a plurality of emitters, wherein:
   the plurality of emitters are configured to emit respective laser beams that are associated with a same spectral range and that are to couple into an input end of a multi-mode optical fiber;
   the plurality of emitters are connected by the single metal contact; and
   an area of an oxide aperture of each emitter, of the plurality of emitters, is less than or equal to an area of a circle with a 3.5 micrometers diameter.

2. The optical data communication device of claim 1, wherein:
   each emitter, of the plurality of emitters, is a single-mode emitter.

3. The optical data communication device of claim 1, wherein:
   each emitter, of the plurality of emitters, is a reduced-mode emitter.

4. The optical data communication device of claim 1, wherein:
   a pitch between adjacent emitters, of the plurality of emitters, is less than or equal to 30 micrometers.

5. The optical data communication device of claim 1, wherein:
   each emitter, of the plurality of emitters, is a vertical cavity surface emitting laser.

6. The optical data communication device of claim 1, wherein:
   the plurality of emitters are disposed in a configuration pattern proximate to the input end of the multi-mode optical fiber, wherein a central region of the configuration pattern is not associated with any emitter of the plurality of emitters; and
   the central region of the configuration pattern is aligned with a central region of the input end of the multi-mode optical fiber that is associated with a core of the multi-mode optical fiber.

7. The optical data communication device of claim 1, further a comprising a lens, wherein:

the lens is configured to converge the respective laser beams on the input end of the multi-mode optical fiber.

8. The optical data communication device of claim 7, wherein:

the plurality of emitters are formed in a substrate; and the lens is formed in the substrate.

9. The optical data communication device of claim 1, further comprising a controller configured to uniformly control the plurality of emitters by modulating power to the plurality of emitters via the single metal contact.

10. An optical data communication device, comprising:

a single metal contact;

a bondpad connected to the single metal contact; and a plurality of emitters, wherein:

the plurality of emitters are configured to emit respective laser beams that are to couple into an input end of a multi-mode optical fiber;

the plurality of emitters are connected by the single metal contact; and a size of an oxide aperture of each emitter, of the plurality of emitters, is less than or equal to 3.5 micrometers.

11. The optical data communication device of claim 10, wherein:

each emitter, of the plurality of emitters, is a single-mode emitter.

12. The optical data communication device of claim 10, wherein:

each emitter, of the plurality of emitters, is a reduced-mode emitter.

13. The optical data communication device of claim 10, wherein:

each emitter, of the plurality of emitters, is a top-emitting vertical cavity surface emitting laser (VCSEL) or a bottom-emitting VCSEL.

14. The optical data communication device of claim 10, wherein:

a pitch between adjacent emitters, of the plurality of emitters, is less than or equal to 30 micrometers.

15. The optical data communication device of claim 10, wherein:

the plurality of emitters are disposed in a configuration pattern proximate to the input end of the multi-mode optical fiber, wherein a central region of the configuration pattern is not associated with any emitter of the plurality of emitters.

16. The optical data communication device of claim 10, further a comprising a lens, wherein:

the lens is disposed between the plurality of emitters and the input end of the multi-mode optical fiber.

17. An optical data communication device, comprising:

a single metal contact;

a bondpad connected to the single metal contact; and a plurality of emitters, wherein:

the plurality of emitters are configured to emit respective laser beams;

the plurality of emitters are connected by the single metal contact; and a size of an oxide aperture of each emitter, of the plurality of emitters, is less than or equal to 3.5 micrometers.

18. The optical data communication device of claim 17, wherein:

a pitch between adjacent emitters, of the plurality of emitters, is less than or equal to 30 micrometers.

19. The optical data communication device of claim 17, wherein:

the plurality of emitters are disposed in a configuration pattern, wherein a central region of the configuration pattern does not include any emitter of the plurality of emitters.

20. The optical data communication device of claim 17, further a comprising a lens, wherein:

the lens is configured to converge the respective laser beams.

* * * * *